United States Patent [19]

Moffitt et al.

[11] 4,395,765

[45] Jul. 26, 1983

[54] MULTIPORT MEMORY ARRAY

[75] Inventors: Bryan S. Moffitt, Eatontown, N.J.; Alexander R. Ross, Allentown, Pa.

[73] Assignee: Bell Telephone Laboratories, Incorporated, Murray Hill, N.J.

[21] Appl. No.: 256,697

[22] Filed: Apr. 23, 1981

[51] Int. Cl.³ .............................................. G11C 7/00
[52] U.S. Cl. ................................... 365/174; 365/203; 365/189
[58] Field of Search ............... 365/149, 174, 177, 189, 365/190, 202, 203

[56] References Cited

U.S. PATENT DOCUMENTS

| | | | |
|---|---|---|---|
| 3,618,050 | 11/1971 | Heeren et al. | 365/189 |
| 3,636,528 | 1/1972 | Morris | 365/190 |
| 3,916,394 | 10/1975 | Fett | 365/190 |
| 3,978,459 | 8/1976 | Koo | 365/190 |
| 4,051,358 | 9/1977 | Schwartz | 364/716 |
| 4,125,877 | 11/1978 | Reinert | 365/190 |
| 4,209,851 | 6/1980 | Ponder | 365/190 |

OTHER PUBLICATIONS

"Telephony and Signal Processing", Chapter 4, Intel Corp., 1980, pp. 4-4-16.

E. Douglas Jensen, "Mixed Mode and Multidimensional Memories", IEEE Catalog No. 72CH0659-3C, Sep. 1972, pp. 119-121.

Teuvo Kohonen, "Associative Memory", Springer-Verlag, 1977, pp. 64-65.

*Primary Examiner*—Joseph A. Popek
*Attorney, Agent, or Firm*—David H. Tannenbaum

[57] ABSTRACT

In a memory array, dual port capability is achieved by an arrangement of the memory cells such that for each cycle of the memory operation two accesses may be performed. This result is achieved by taking advantage of the bit line precharging interval. A second bit line accessing pair is added to each memory element, and each cycle is split so that when one bit line is in the accessing mode, the other bit line is in the precharging mode. Using this technique the speed of the memory is effectively doubled.

7 Claims, 3 Drawing Figures

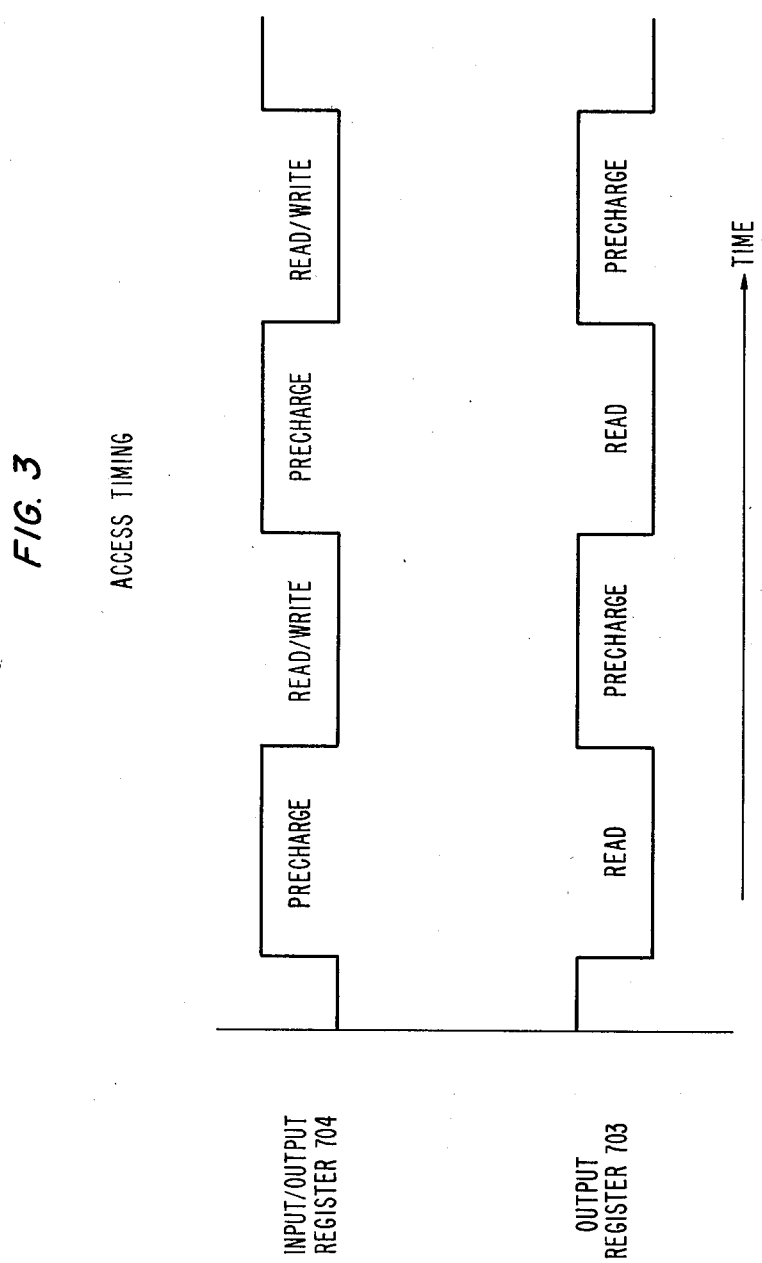

MULTIPORT MEMORY ARRAY

BACKGROUND OF THE INVENTION

This invention relates to an accessing technique for a memory array and more particularly to such a technique which allows multiport accessing capability without increasing the total access time of the memory array.

One standard method of accessing a memory array is to provide, for each bit location, a dual accessing line such that the binary signal, either a "0" or a "1", is provided on one line of the pair of lines and the compliment is provided on the other line of the pair. Thus, for a given accessing pair of lines, arbitrarily called A, one line would be "A" while the other would be "$\bar{A}$".

To write a "1" into a bit location, for example into location A1, line "A" would be high. At this time two transmission gates between the access lines and memory cell A1 would open controlled by a word select decoder. Since the "A" lead has the high signal applied to it, cell A1 is forced to establish a "1" thereat.

For read operations the sequence has a precharging interval when both access lines "A" and "$\bar{A}$" are held high. However, at the end of the precharging interval the high signals are removed from both leads, and they remain high due to parasitic capacitance. The transmission gates are then opened between the access lines and the memory cell. Since there is no maintenance of the high signal on either lead, the memory array flip-flop provides signals on leads "A" and "$\bar{A}$" representative of the condition of cell A1. Thus, if the cell had a "1" stored thereat, lead "$\bar{A}$" would be left high, and lead "A" would be discharged low. The precharging is required because the memory cells have low power loads and are only capable of discharging the access lines.

The precharging and reading intervals are timed with two phases of a clock. This clock and memory array constitute a synchronously read memory system. The write operation also operates synchronously and thus has a precharge interval, but the precharge is overdriven with the input data and the interval is only used for address and data setup.

Situations exist where it is desired to access a single memory array from more than one port. Typically, this would be achieved by using a multiplexer arrangement at the single port access point and the input/output from the memory would be shared between various registers. This arrangement becomes cumbersome for control purposes and could be costly to implement. An even further drawback to such an arrangement occurs when the memory is already being accessed at its maximum speed for a single port. In such a situation, since the accessing time is fixed, the addition of extra ports causes a reduction in accessing capability from any one port. Accordingly, real time memory operation is impossible to guarantee.

This problem has been overcome in the past by arranging two memories and sequencing between memories for alternate operations. For example, in time slot interchange operations, a frame would be read into a first memory during a first cycle. During the next cycle, the frame would read out of the first memory, while a second frame would be read into the second memory. During the next cycle, the third frame would be read into the first memory, while the second frame would be read from the second memory.

Thus, a need exists in the art for a single memory having multiport capability and where multiple accesses may occur during the same memory cycle, which memory operates without complex peripheral control.

SUMMARY OF THE INVENTION

Multi-port memory capability is achieved by an arrangement of the memory cells such that for each cycle of the memory operation, multiple accesses may be performed. This result is accomplished by providing a structure which allows individual cell access on a concurrent basis and which insures that any one cell is not accessed concurrently from more than one port. The arrangement includes the addition of extra bit line access pairs to each memory element, with each access pair serving a separate port. In one embodiment, separate accessing is achieved by selectively controlling the inputs such that in all situations different cells are addressed at any one cycle of the memory.

In a second embodiment the ports are separated by clock signal phaser which alternates the precharging and accessing intervals between the ports to insure that while one port is actually reading data, the other port is in the precharging mode. By utilizing the proper clock phase for each accessing line, making them out of phase with each other, it is possible to insure that when one access line is in the precharging mode, another access line may actually access information from any memory cell.

BRIEF DESCRIPTION OF THE DRAWING

These and other objects and features, together with the operation and utilization of the present invention, will be more fully apparent from the illustrative embodiment shown in conjunction with the drawing in which:

FIG. 3 shows a timing chart for controlling the access between the dual ports of FIG. 1.

DETAILED DESCRIPTION

Figure 1:
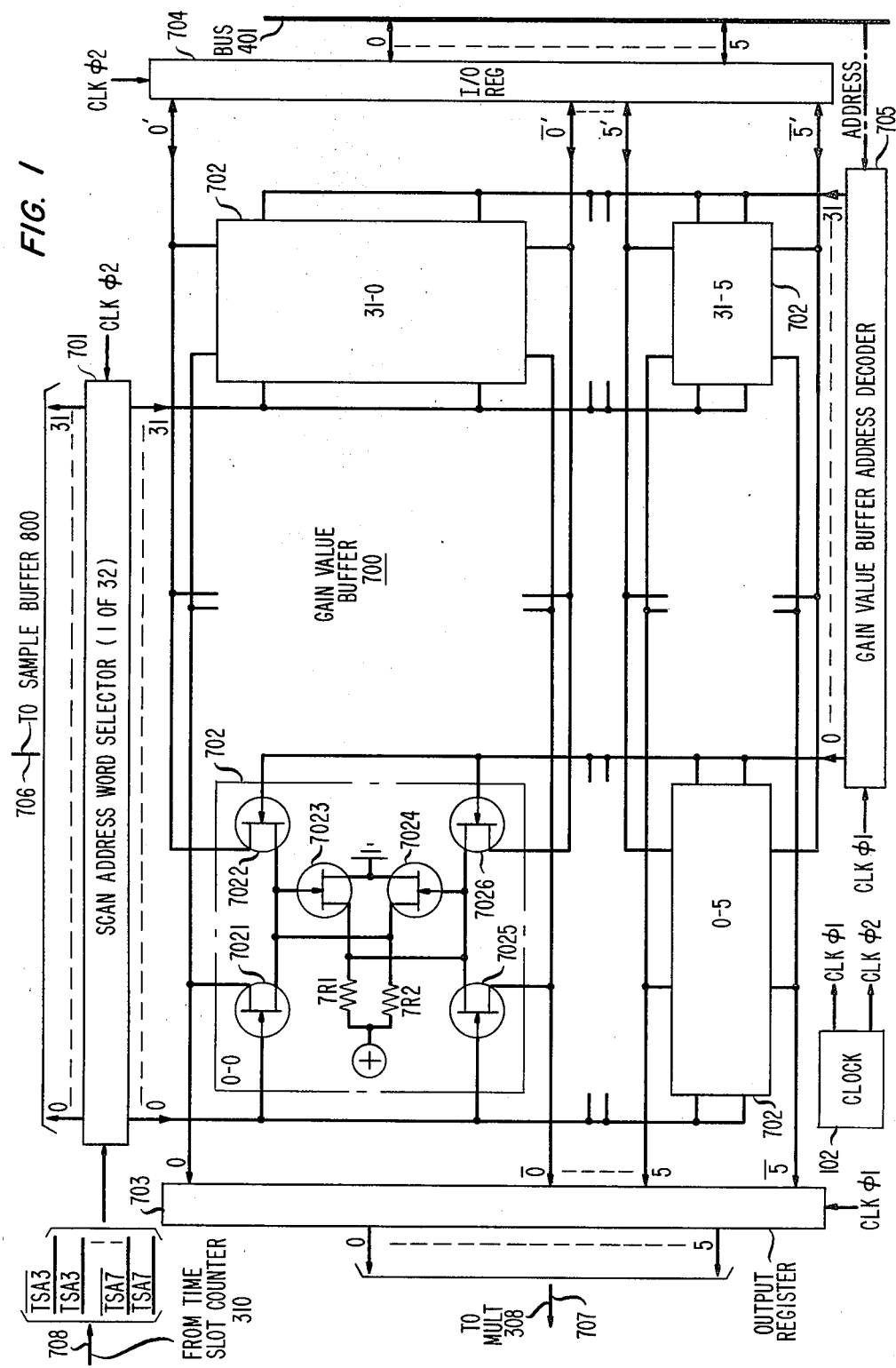
FIG. 1 shows a memory having a second accessing pair of leads.

As shown in FIG. 1, the dual memory, shown as gain value buffer 700, consists of an NMOS memory array of prior art (FIG. 2) modified to provide dual access capability. Memory 700 can be accessed either via register 703 or via register 704, each operating with two independent addresses and with two independent data buses. This structure is included in the illustrative embodiment of two concurrently filed copending patent applications, one of B. S. Moffitt, Ser. No. 256,970 and one of Baxter et al, Ser. No. 256,937, which applications are hereby incorporated by reference. The terminology used to identify the memory and the registers is the same as used in those applications to avoid confusion. It is to be understood that the dual memory which is the subject of our invention can be used in a wide range of applications.

Bus 401 provides signals for read or write purposes and can access any of the 32 locations (0–31) selected by address decoder 705. Simultaneously, and independently, bus 707 can read out, if so desired, any of the 32 locations selected by address decoder 701. Both buses are extended as bit line pairs (for example, bit line pair 0, $\bar{0}$) through all of the memory locations and, as will be seen, access from either bus does not restrict access from the other bus. Bit line pairs are used as set/reset lines for write operations and as differential outputs for read operations as described prior. Bit line pair $0^1$ and $\overline{0}^1$ of register 704 is extended to bit cells 702 of the top row (0-0 to 31-0) and bit line pair 0 and $\overline{0}$ of register 703 is also extended to these same cells.

Figure 2:
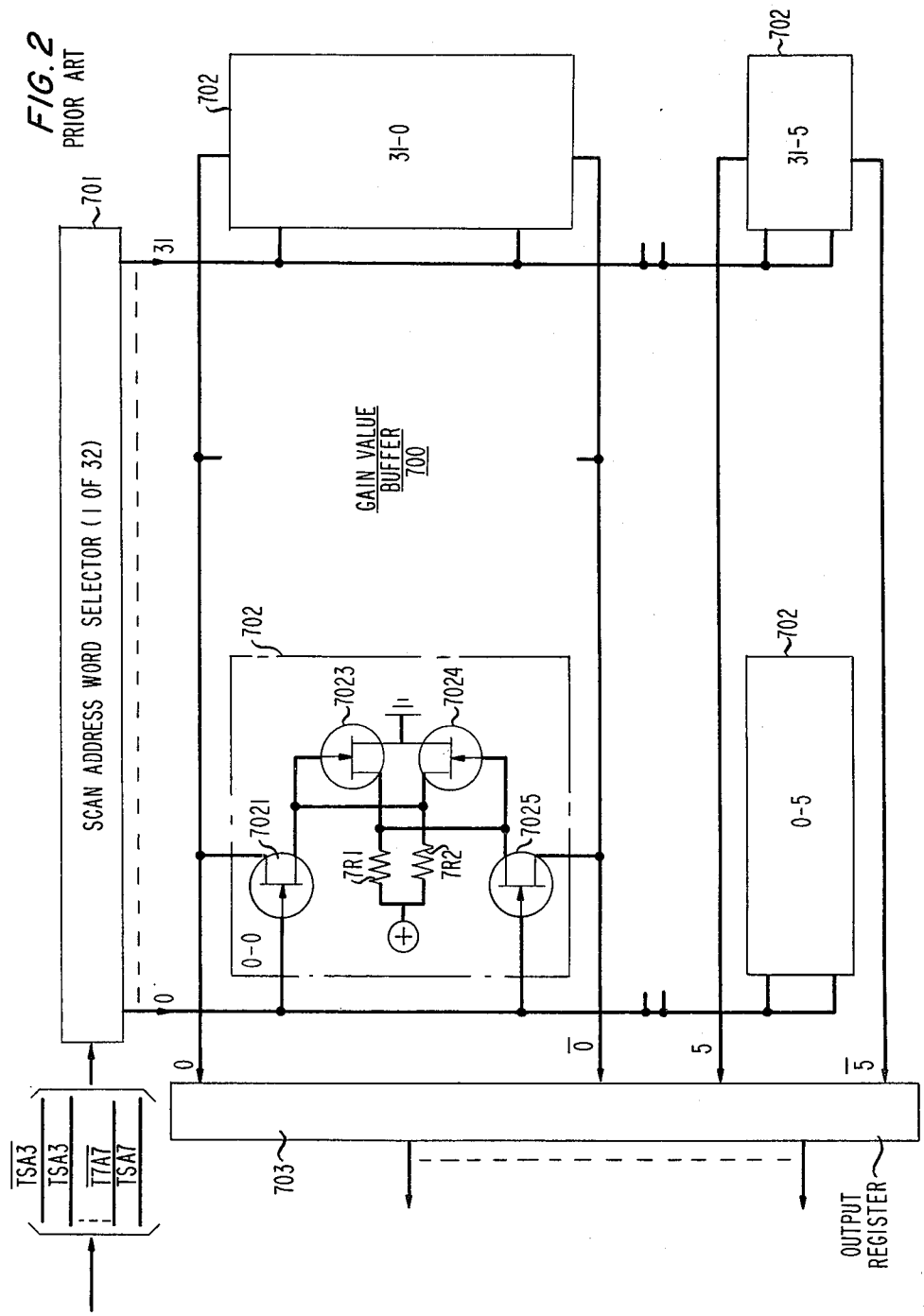
FIG. 2 shows a prior art memory having a single access pair.

In a non-modified NMOS memory array as seen in FIG. 2, one set of bit line pairs and one I/O register with one address decoder would be connected to the memory array. For purposes of this discussion we will assume this to be decoder 701 and register 703. Any read or write operation is a two step process. The first step is to precharge all the bit line pairs. This precharging arrangement is well known. Thus, lines $\emptyset$ to 5 and $\overline{\emptyset}$ to $\overline{5}$ are driven to a high state by circuits in the register 703. This prevents the lines from changing the data in the bit cells during the next step.

For a read, the next step is to turn off the precharge drive and turn on one of the word select lines from the decoder 701. Turning off the precharge drive leaves the bit lines capacitively charged high, while the word select line turns on corresponding transmission gates 7021 and 7025. These transmission gates allow the bit cell to pull down one of the bit lines ($\emptyset$ or $\overline{\emptyset}$ depending on the stored data) for each cell on the same column. Each bit line pair thus conforms to the data stored in the associated selected bit cell and the register then latches this data for output.

The bit cell resistors 7R1 and 7R2 are high value to minimize memory power consumption whereas transistors 7023 and 7024 are high power to be capable of pulling either bit line low. The precharge is required because the resistors are not capable of pulling the bit lines high.

For a write, the next step is to replace the precharge drive with the drive of the input data, and turn on one of the select lines. The input data overrides the precharge and the bit cell data causing the cell data to be set or reset depending on the input data.

The precharge and read/write operations are controlled by clock signals. The precharge is performed when clock is high and the read or write is performed when clock is low.

The dual bus scheme, as shown in FIG. 1, allows a two phase operating memory system whereby two independent sets of I/O registers and word selectors can access all of the same memory cells on opposite phases of a clock signal. When one of the registers, such as input/output register 703 is in the precharge mode the actual flip-flop of the memory cell is isolated by gates 7021 and 7025 from that register's bit access lines. During that same time the other register, such as output register 704, can be in the read/write phase actually accessing the same cell. This alternate operation is controlled by oppositely phased clock signals, provided by clock 102. The phase relationship between these signals is shown in FIG. 3. This phase difference prevents the potentially disastrous condition of having both bit lines simultaneously selecting the same bit cell. With the embodiment shown, bus 707 is only used for read operations, but may also be used for both read and write operations, if so desired.

The dual bit line/dual phase operation allows memory 700 to effectively double its speed so that twice as many accesses can occur through independent ports in the same time interval.

This same dual phase arrangement can be further expanded by having three bit line pairs and three access ports and bus selection logic for two of the three access ports. Address selection logic for one output port can be shared between input/output registers. The other two ports are operable via separate registers. Addresses are simultaneously present to each register and on external bus selector controls when and from which bus data will be written into the memory. This arrangement provides a flexible three port memory system in which two ports are inputs and may perform simultaneous writes to more than one location and from either of two buses, while the third port is an output and provides simultaneous reads from a third bus. Since two ports are both running on the same clock phase this could create a conflict for writes except that the bus selection logic insures that for any given location only one bus will provide the write data at any one time. The third bus runs on the opposite phase and thus cannot conflict with either of the other two.

What is claimed is:

1. A memory array having a plurality of memory storage elements,
a first pair of access lines associated with said elements for providing precharged interrogate signals to said elements, and wherein each said element is arranged to respond to said precharged interrogate signals with the signal value stored thereat, said response occurring at a time immediately following the precharging of said first access lines, said elements further arranged to be isolated from said first access lines during said precharging interval, characterized in that there is provided a second pair of access lines associated with said elements, said second pair of access lines being independent from said first pair of access lines for providing precharged interrogate signals to said elements, said second pair of access lines being adapted to receive precharge interrogate signals at a time different from the precharging of interrogate signals on said first pair of access lines thereby allowing said associated elements to respond with the signal value stored thereat over said second pair of access lines independent from said response over said first pair of access lines.

2. The invention set forth in claim 1 wherein said precharging of said second pair of access lines is controlled from opposite clock phases of a precharge and read/write clock.

3. The invention set forth in claim 2 wherein said memory array is an NMOS array.

4. The invention set forth in claim 1 further comprising a first input/output register associated with said first pair of accessing lines and a second input/output register associated with said second pair of accessing lines, each said register arranged to generate said precharging interrogate signals in response to input signals applied thereto from an external source, said registers also arranged to provide said external source with said response signals from said associated memory elements.

5. A memory system operable for providing multiple single cycle access to a memory, said system comprising
a memory array having a plurality of individually addressable memory storage elements, arranged in rows and columns,
first clock control signals having a read/write signal, a precharge signal and column select signals,
a first group of access lines, said group divided into pairs with individual pairs associated with said memory elements of each row for precharging interrogate signals to said row of elements under control of said precharge first clock signal, each said memory element arranged to respond to supplied interrogate signals and to said column select signals provided on a selected column with the signal value stored at each row of said selected column, said response controlled by said first clock read/write signal, said elements further arranged to be isolated from said first group of access lines during said precharging interval, second clock control signals having a read/write signal, a precharge signal and column select signals, said signals from said first and second clocks being oppositely phased, and a second group of access lines, said group divided into pairs with individual pairs associated with said memory elements, said second pair of access lines being independent from said first pair of access lines for precharging interrogate signals to said elements under control of said precharge second clock signals, each said memory element arranged to respond to supplied interrogate signals and said second clock column select signals provided on a second selected column with the signal value stored at each row of said second selected column, said response controlled by said second clock read/write signal.

6. The invention set forth in claim 5 wherein said memory array is an NMOS array.

7. A memory array having a plurality of individually addressable memory storage elements said elements arranged in columns and rows, means for addressing each column of said memory storage elements, said means including first and second access registers, and first and second selectors associated with said element columns, a first pair of access lines associated with each row of said elements and with said first access register for providing first and second precharged activation signals to a particular one of said elements within said row identified jointly by signals from said first access register and said first selector, a second pair of access lines associated with each row of said elements and with said second access register for providing first and second precharged activation signals to a particular one of said elements within said row identified jointly by signals from said second access register and said second selector, each said element arranged to respond to said first precharged activation signals with the signal value stored thereat, and to respond to said second precharged activation signal by storing at said element a signal value provided at the corresponding access register, each said response occurring at a time immediately following the precharging of said access lines, said elements further arranged to be isolated from said access lines during said corresponding precharging interval.

* * * * *